(12) United States Patent
Yasuta et al.

(10) Patent No.: US 9,069,008 B2
(45) Date of Patent: Jun. 30, 2015

(54) INSPECTION APPARATUS FOR SEMICONDUCTOR DEVICES AND CHUCK STAGE FOR THE INSPECTION APPARATUS THAT IS MOVABLE WITH RESPECT TO THE FRONT AND BACK SIDE ELECTRODES

(71) Applicant: KABUSHIKI KAISHA NIHON MICRONICS, Musashino-shi (JP)

(72) Inventors: Katsuo Yasuta, Musashino (JP); Hikaru Masuta, Musashino (JP); Hideki Nei, Musashino (JP)

(73) Assignee: KABUSHIKI KAISHA NIHON MICRONICS, Musashino-Shi, Tokyo (JP)

( * ) Notice: Subject to any disclaimer, the term of this patent is extended or adjusted under 35 U.S.C. 154(b) by 252 days.

(21) Appl. No.: 13/705,531

(22) Filed: Dec. 5, 2012

(65) Prior Publication Data
US 2013/0141132 A1 Jun. 6, 2013

(30) Foreign Application Priority Data

Dec. 5, 2011 (JP) ................................ 2011-265792

(51) Int. Cl.
*G01R 31/26* (2014.01)
*G01R 1/04* (2006.01)
*G01R 1/067* (2006.01)
*G01R 31/28* (2006.01)
*G01R 1/073* (2006.01)

(52) U.S. Cl.
CPC .............. *G01R 1/0408* (2013.01); *G01R 31/26* (2013.01); *G01R 31/2865* (2013.01); *G01R 1/06705* (2013.01); *G01R 1/07307* (2013.01); *G01R 31/2608* (2013.01); *G01R 31/2648* (2013.01)

(58) Field of Classification Search
CPC ........... G01R 31/2891; G01R 1/06711; G01R 1/07307; G01R 1/067; G01R 1/06772; G01R 31/2886; G01R 31/2887; G01R 1/06705; G01R 1/06733; G01R 27/205; G01R 31/2601; G01R 31/2831; G01R 31/2856; G01R 31/2874; G01R 35/00; G01R 31/2865; G01R 31/2875; G01R 31/2608; G01R 31/2648; G01R 1/0408; H01L 21/6831; H01L 21/6833; H01L 21/6838
See application file for complete search history.

(56) References Cited

U.S. PATENT DOCUMENTS 4,195,259 A * 3/1980 Reid et al. ................ 324/750.19
5,550,480 A * 8/1996 Nelson et al. ............ 324/756.03
(Continued)

FOREIGN PATENT DOCUMENTS

| JP | 05333098 A | 12/1993 |
|----|------------|---------|
| JP | 2007040926 A | 2/2007 |

(Continued)

*Primary Examiner* — Vinh Nguyen
(74) *Attorney, Agent, or Firm* — Browdy and Neimark, PLLC

(57) ABSTRACT

An inspection apparatus is provided, which includes probes for front side electrodes, probes for back side electrodes, and a chuck stage. The probes for front side electrodes and the probes for back side electrodes are formed on the upper surface of the chuck stage, and the probe contact area electrically continues to the wafer holding area, and the probes for front side electrodes and the probes for back side electrodes are located leaving a distance in horizontal direction between them so that the probes for back side electrodes move relatively within the probe contact area when the probes for front side electrodes are moved relatively within the wafer under test by the movement of the chuck stage.

9 Claims, 8 Drawing Sheets

(56) References Cited

U.S. PATENT DOCUMENTS

| | | | |
|---|---|---|---|
| 7,068,056 B1 * | 6/2006 | Gibbs et al. | 324/750.16 |
| 7,924,035 B2 * | 4/2011 | Huebner | 324/754.01 |
| 2006/0279304 A1 * | 12/2006 | Kuitani et al. | 324/761 |

FOREIGN PATENT DOCUMENTS

| | | |
|---|---|---|
| JP | 2008101944 A | 5/2008 |
| JP | 2011138865 A | 7/2011 |

* cited by examiner

INSPECTION APPARATUS FOR SEMICONDUCTOR DEVICES AND CHUCK STAGE FOR THE INSPECTION APPARATUS THAT IS MOVABLE WITH RESPECT TO THE FRONT AND BACK SIDE ELECTRODES

BACKGROUND OF THE INVENTION

1. Field of the Invention

The present invention relates to an inspection apparatus for semiconductor devices and a chuck stage used for the inspection apparatus. In particular, the present invention relates to an inspection apparatus which inspects electrical characteristics of semiconductor devices having electrodes on both sides of a wafer, and a chuck stage suitable for the inspection apparatus.

2. Description of the Related Art

Power semiconductor devices, such as power transistor and IGBT (Insulated Gate Bipolar Transistor), and other semiconductor devices, such as LED and semiconductor laser, have electrodes on both sides of the wafer because they are designed so that electric currents will flow vertical to the chips. It is therefore necessary to bring test probes into contact with the surfaces on both sides of the wafer in order to inspect electrical characteristics of such semiconductor devices in wafer state. Various inspection apparatuses have been proposed to bring test probes into contact with the back side of the wafer just under the semiconductor device under test.

Japanese Patent Kokai Hei 5-333098 (JP1993/333098 A1), for example, discloses an inspection apparatus for inspecting electrical characteristics of semiconductor devices having electrodes on both sides of a wafer, in which a number of probes are placed in a chuck stage which holds a wafer, and the probes being just under the back side of the device to be tested are selectively connected to a tester.

In the inspection apparatus disclosed in the Japanese Patent Kokai No. Hei 5-333098 (JP1993/333098 A1), it is necessary to move the chuck stage with respect to the probes positioned above the wafer so as to inspect all semiconductor devices formed on the wafer one by one. The inspection apparatus therefore requires relatively long cables to connect the tester to the probes placed in the chuck stage. As the cables which connect the tester to the probes become long, parasitic inductance of measuring lines composed by the cables becomes large, and it becomes difficult to obtain transient characteristics necessary to conduct large current test close to the actual performance of the semiconductor device under test and dynamic characteristics test. Because of this, even if the semiconductor devices pass the inspection in wafer state, characteristics failure is sometimes found in them in the final full-spec inspections conducted after bonding, molding, and burn-in processes. When characteristics failure is found in the final full-spec inspections, the various processes carried out after the inspection in wafer state become useless, which invites disadvantages such as rise of product cost and increase of waste volume.

On the other hand, the Japanese Patent Kokai No. 2007-40926 (JP2007/40926 A1) and Japanese Patent Kokai No. 2008-101944 (JP2008/101944 A1) disclose inspection apparatuses, in which a semiconductor device is placed on a conductive base which is larger than the semiconductor device, and probes for back side electrodes are brought into contact with the exposed part of the base where the semiconductor device does not exist, when probes for front side electrodes are brought into contact with front surface of the semiconductor device. The inspection apparatuses disclosed in the publications are not an apparatus which inspects semiconductor devices in wafer state, but an apparatus which inspects a semiconductor device exists individually. Therefore, the publications give no suggestions about how to measure the characteristics of semiconductor devices having electrodes on both sides in wafer state accurately.

In view of the situation above mentioned, the present applicant proposed in the Japanese Patent Kokai No. 2011-138865 (JP2011/138865 A1) an inspection apparatus for inspecting semiconductor devices in wafer state, which has a chuck stage, and POGO pins electrically connected to the upper surface of the chuck stage and located at outer edge of the chuck stage. The POGO pins are brought into contact with a chuck lead plate located above and connected to a tester, thereby attempting to make short the length of a line which electrically connects back side electrodes of a wafer and the tester. The inspection apparatus makes it possible to measure accurately electrical characteristics of semiconductor devices having electrodes on both sides of the wafer, such as power semiconductor devices, in wafer state, and is preferable. However, if an inspection apparatus composed differently but being able to measure accurately in the same or almost same level as the proposed inspection apparatus is provided, which is more preferable.

The present invention was made in view of the conventional technical situation as above mentioned. The aim of the present invention is to provide an inspection apparatus for semiconductor devices which is simple in composition and is able to measure the characteristics of semiconductor devices having electrodes on both sides of a wafer accurately in wafer state, and a chuck stage used for the inspection apparatus.

SUMMARY OF THE INVENTION

After having diligently studied to attain the aim, the present inventors have found that, when the shape of a chuck stage is specifically designed instead of relying upon the POGO pins and the chuck lead plate disclosed in the Japanese Patent Kokai No. 2011-138865 (JP2011/138865 A1), it is possible to make short the length of an electrical path between a tester and probes with simple composition, and thereby realizing accurate measurements in wafer sates of the electrical characteristics of semiconductor devices having electrodes on both sides of a wafer.

The present invention attains the aim as above mentioned by providing an inspection apparatus for semiconductor devices, which comprises;

probes for front side electrodes, probes for back side electrodes, a chuck stage which relatively moves with respect to the probes for front side electrodes and the probes for back side electrodes, a wafer holding area which holds a wafer to be inspected, and a probe contact area which is conductive and covers an area having the same size and the same shape as the largest wafer to be held on the wafer holding area, wherein, the wafer holding area and the probe contact area are formed on the upper surface of the chuck stage close to each other but without overlapping of the areas, the wafer holding area has conductive contact parts which are to be in contact with the back side of the wafer, and the probe contact area electrically continues to the conductive contact parts of the wafer holding area, and, wherein the probes for front side electrodes and the probes for back side electrodes are placed leaving a distance in horizontal direction between them so that the probes for back side electrodes relatively move within the probe contact area when the probes for front side electrodes are relatively moved within the wafer under test by the movement of the chuck stage.

The present invention also attain the aim as mentioned above by providing a chuck stage used for the inspection apparatus of the present invention.

In the inspection apparatus of the present invention, a chuck stage, which holds a wafer to be inspected, has a probe contact area as mentioned above in addition to a wafer holding area which holds a wafer. Accordingly, the probes for back side electrodes are always able to be in contact with the probe contact area and it is not necessary to move the probes for back side electrodes, even when the chuck stage is moved with respect to the probes for front side electrodes in order to inspect individual semiconductor device on the wafer one by one. Because of this, it is possible to always keep shortest and constant not only the length of the electrical connecting path between the tester and the probes for front side electrodes, but also the length of the electrical connecting path between the tester and the probes for back side electrodes. Therefore, it is possible to obtain transient characteristics necessary to conduct large current test close to the actual performance of the semiconductor device under test and dynamic characteristics test by minimizing parasitic inductances which may be created in the measuring lines.

In addition, according to the inspection apparatus of the present invention, it is possible to perform the inspection of electrical characteristics of semiconductor devices by bringing both of the probes for front side electrodes and the probes for back side electrodes into contact with a semiconductor device on the wafer and the probe contact area, respectively, from front side of the wafer. Therefore, the structure of the inspection apparatus can be made simple, and it is very easy to confirm the contact state between the probes and the semiconductor devices or the probe contact area. Furthermore, exchange operations of the probes as well as maintenance of the chuck stage including the wafer holding area become easier, which are advantageous effects.

Moreover, in one preferable example, the probes for front side electrodes and the probes for back side electrodes of the inspection apparatus of the present invention have one or more force probes and one or more sense probes. When the inspection apparatus of the present invention equips one or more force probes and one or more sense probes, it is possible to measure the electrical characteristics of semiconductor devices accurately by four point probe method. The probes for front side electrodes and the probes for back side electrodes of the inspection apparatus of the present invention may comprise probes other than force and sense probes. Depending upon the types of semiconductor devices to be inspected, the probes for front side electrodes, for example, may comprise a gate probe and/or a base probe in addition to the force and sense probes.

The inspection apparatus of the present invention, in one preferable example, comprises a conductive component for force line, which is placed parallel to the upper surface of the chuck stage and along the straight line connecting the probes for front side electrodes and the probes for back side electrodes. One end of the conductive component for force line on the side of the probes for front side electrodes is electrically connected to the one or more force probes comprised in the probes for front side electrodes, and the other end of the conductive component for force line is connected to a tester. When the inspection apparatus of the present invention comprises the conductive component for force line, the electrical path which goes from the tester to the force probes in the probes for front side electrodes becomes parallel to the electrical path which goes from the conductive contact parts in the wafer holding area to the probe contact area, and the direction of the former path is opposite to that of the latter path. Accordingly, the magnetic fields produced by the two paths are cancelled each other and the inductance which may be produced can be reduced.

While it depends on the length of the conductive component for force line, the produced inductance can be reduced to about one-forth by placing the conductive component for force line as compared with the case where the conductive component for force line is not placed. The conductive component for force line can be in any shape as long as the magnetic field produced by the electrical path which goes from the conductive contact parts in the wafer holding area to the probe contact area is cancelled by the magnetic field produced by the electric current which flows in the conductive component for force line. For example, the conductive component for force line in plate shape is preferably used. The one end of the conductive component for force line, which is connected to the tester, is preferably located near to the probes for back side electrodes in order to make longer the electrical paths which are parallel each other and opposite in direction.

Furthermore, in one preferable embodiment of the inspection apparatus of the present invention, the upper surface of the chuck stage is made of a conductive material, and a part of the upper surface made of a conductive material forms the conductive contact parts of the wafer holding area, and another part of the upper surface made of a conductive material forms the probe contact area. In this case, since the conductive contact parts in the wafer holding area electrically continues to the probe contact area directly through the upper surface of the chuck stage, no specific connecting means is needed and the structure of the inspection apparatus becomes simple, which is preferable. In another preferable embodiment, a conductive sheet is placed on the conductive upper surface of the chuck stage to form the probe contact area. In this case, it is possible to exchange the conductive sheet only when the probe contact area is damaged by repeated contacts with the probes for the back side electrodes, which reduces time and cost needed for maintenance and is preferable.

In addition, in another preferable embodiment of the inspection apparatus of the present invention, the upper surface of the chuck stage is divided into a number of long rectangular parts which are parallel to each other and lie along the line connecting the wafer holding area and the probe contact area, and a number of the parts consist of conductive components and electrically insulating components which are located one after the other, and a part of the upper surface of the conductive components forms the conductive contact parts of the wafer holding area and another part of the upper surface of the conductive components forms the probe contact area. In the case that the upper surface of the chuck stage is composed by the conductive components and the electrically insulating components located one after the other, the electrical continuing paths which go from the back side of the wafer to the probes for back side electrodes are limited to the long rectangular conductive components along the straight line connecting the wafer holding area and the probe contact area. Accordingly, the parasitic inductances and the parasitic capacitances, which may be produced, are well reduced, thereby improving the transient characteristics during the inspection and realizing high speed and more accurate inspection, which are advantageous effects.

According to the inspection apparatus for semiconductor devices of the present invention and the chuck stage of the present invention, it is not necessary to move the probes for back side electrodes, even when the chuck stage is moved with respect to the probes for front side electrodes in order to inspect the semiconductor devices on a wafer one by one. Therefore, it is possible to always keep shortest and constant the lengths of the electrical paths which connect the tester and the probes for front side electrodes and the tester and the probes for back side electrodes. Due to this, the parasitic inductances produced in the measuring lines can be minimized and thereby it becomes possible to obtain the transient characteristics necessary to conduct large current test close to the actual performance of the semiconductor device under test and dynamic characteristics test. Accordingly, the advantageous effects that the inspection of semiconductor devices can be conducted accurately in wafer state are obtained according to the present invention.

According to the inspection apparatus of the present invention, it is possible to perform the inspection of electrical characteristics of semiconductor devices by bringing both of the probes for front side electrodes and the probes for back side electrodes into contact with the front side electrodes of a semiconductor device on the wafer and the probe contact area, respectively, from front side of the wafer. Therefore, the structure of the inspection apparatus of the present invention can be very simple, and the contact state between the probes and the semiconductor devices or the probe contact area can be confirmed easily. Furthermore, the advantageous effects that exchange operations of the probes as well as maintenance of the chuck stage including the wafer holding area become easier are obtained.

Moreover, in the case that the inspection apparatus of the present invention comprises a conductive component for force line which is located parallel to the upper surface of the chuck stage along the straight line connecting the probes for front side electrodes and the probes for back side electrodes, the electric path which goes from the tester to the force probes in the probes for front side electrodes and the electric path which goes from the conductive contact parts in the wafer holding area to the probe contact area are parallel to each other and opposite in directions. Therefore, the magnetic fields produced by the both electric paths are cancelled each other, and the inductance which may be produced is reduced, thereby realizing the inspection with improved transient characteristics and accuracy.

Furthermore, in the case that the upper surface of the chuck stage consists of the conductive components and the electrically insulating components located one after the other, the electrical paths which go from the back side of a wafer to the probes for back side electrodes are limited to the long rectangular conductive components. Therefore, the parasitic inductances and the parasitic capacitances, which may be produced, are well reduced, thereby the advantageous effects that the transient characteristics during the inspection are improved and high speed and more accurate inspection is realized.

In addition, in the inspection apparatus for semiconductor devices of the present invention, since a wafer is held on the wafer holding area of the chuck stage with the back side of the wafer being in contact with the upper surface of the wafer holding area, it is easy to heat the wafer and there is no risk that the wafer is deformed and/or damaged by the weight of the wafer itself or the pressure applied by probing, even if the wafer is thin.

DESCRIPTION OF THE PREFERRED EMBODIMENTS

Hereinafter, the present invention is explained in detail with reference to the accompanying drawings picking up IGBT, which is one of power semiconductor devices, as an example of a semiconductor device inspected by the inspection apparatus of the present invention. As a matter of course, the power semiconductor devices inspected by the inspection apparatus of the present invention are not limited to IGBT, and the present invention is not limited to the illustrated examples.

Figure 1:
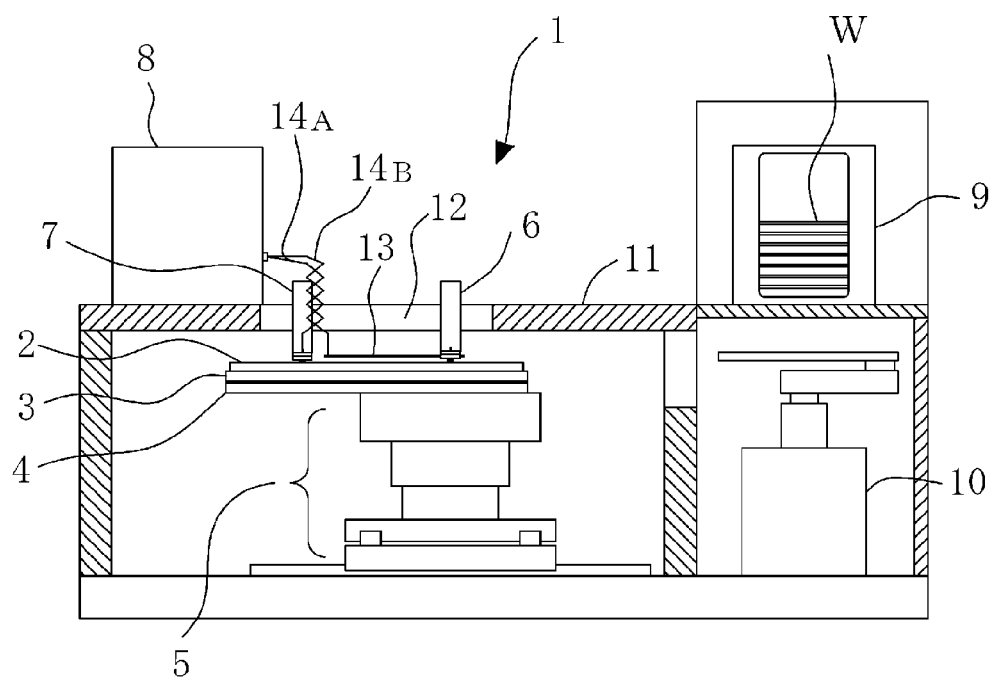
FIG. 1 is a partial cross section of a front view of an example of an inspection apparatus for semiconductor devices of the present invention.
Figure 2:
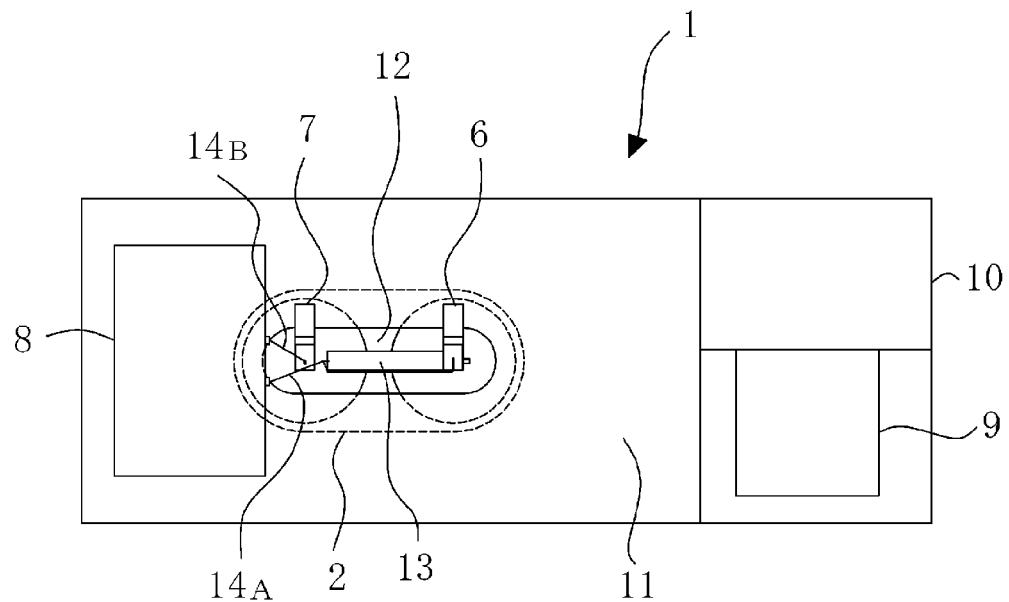
FIG. 2 is a plane view of the inspection apparatus for semiconductor devices of the present invention.

FIG. 1 is a partial cross section of a front view showing an example of an inspection apparatus for semiconductor devices according to the present invention. FIG. 2 is a plane view of the inspection apparatus as shown in FIG. 1. In FIG. 1 and FIG. 2, the reference numeral 1 indicates the inspection apparatus for semiconductor devices of the present invention. The reference numeral 2 indicates a chuck stage, the reference numeral 3 indicates an electric insulating plate on which the chuck stage 2 is placed and held, and the reference numeral 4 indicates a thermal insulating plate. A heater, which is explained later, is placed between the electric insulating plate 3 and the thermal insulating plate 4. The reference numeral 5 indicates XYZ-θ stage, which moves the chuck stage 2 in X, Y, Z and θ directions together with the electric insulating plate 3 and the thermal insulating plate 4. The reference numeral 6 indicates a manipulator which holds probes for front side electrodes. The reference numeral 7 indicates a manipulator which holds probes for back side electrodes, and the reference numeral 8 indicates a tester. The probes for front side electrodes and the probes for back side electrodes are able to be moved in X, Y and Z directions in narrow range by the manipulator 6 and the manipulator 7, respectively.

The reference symbol W indicates a wafer to be inspected. The reference numeral 9 indicates a wafer cassette which stores wafers W, and the reference numeral 10 indicates a wafer handling equipment, which takes out a wafer W from the wafer cassette 9 to place it on a below mentioned wafer holding area of the chuck stage 2, and takes away a wafer W, for which inspection has been finished, from the wafer holding area to outside. There are no limitations on a mechanism which makes it possible for the wafer handling equipment 10 to convey a wafer W as long as the wafer handling equipment 10 can convey a wafer W. A wafer handling equipment utilizing Bernoulli system, for example, is preferably employed.

The reference numeral 11 indicates an upper base plate of the inspection apparatus 1. The upper base plate 11 has an elliptic hole 12. The manipulator 6 and the manipulator 7 are fixed on the fringe of the elliptic hole 12 of the upper base plate 11. Each of the manipulator 6 and the manipulator 7 has a cantilever arm and a holding component attached to the tip of the cantilever arm and protrudes downward through the elliptic hole 12. With the cantilever arms and the holding components, the manipulator 6 and the manipulator 7 hold the below mentioned probes for front side electrodes and back side electrodes, respectively, at a position below the upper base plate 11. The probes for front side electrodes and the probes for back side electrodes are able to be moved independently by manipulator 6 and the manipulator 7, respectively, in X, Y, and Z directions. The reference numeral 13 indicates a conductive component for force line, and $14_A$ and $14_B$ are conductive cables. The probes for front side electrodes are connected to the tester 8 via the conductive component for force line 13 and the conductive cable $14_A$, and the probes for back side electrodes are connected to the tester 8 via the conductive cable $14_B$. The inspection apparatus 1 has a microscope and/or an imaging apparatus for alignment, which are not illustrated, in addition to the components mentioned above.

Figure 3:
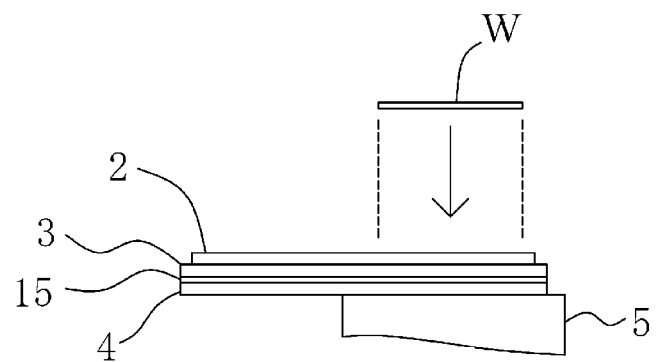
FIG. 3 is an enlarged front view showing only the chuck stage and its neighboring part of the inspection apparatus.

FIG. 3 is an enlarged front view showing only the chuck stage 2 and its neighboring part of the inspection apparatus 1. In FIG. 3, the reference numeral 15 is a heater inserted between the electric insulating plate 3 and the thermal insulating plate 4. When electric power is supplied from not illustrated power source, the heater 15 heats the chuck stage 2 together with a wafer W placed on the wafer holding area of the chuck stage 2. A temperature sensor, not illustrated, is attached to the wafer holding area. The chuck stage 2 and the wafer W placed on the wafer holding area can be heated at a prescribed temperature by controlling electric power supplied to the heater 15 based on a signal from the temperature sensor.

Figure 4:
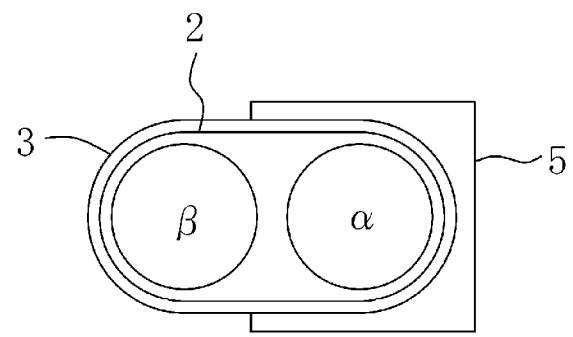
FIG. 4 is a plane view of FIG. 3.

FIG. 4 is a plane view of FIG. 3. As shown in FIG. 4, the wafer holding area indicated by the symbol α and a probe contact area indicated by the symbol β are formed on the upper surface of the chuck stage 2 close to each other but without overlapping of the areas. The wafer holding area α has an appropriate vacuum mechanism, such as suction grooves connected to a vacuum source, not illustrated. By the vacuum mechanism, the wafer holding area α sucks and holds a wafer W with the upper surface of the area being in contact with the back side of the wafer W.

There are no limitations on the size of the wafer holding area α as long as the wafer holding area α is able to hold the largest wafer W expected to be inspected by the inspection apparatus 1. Since a wafer W to be inspected usually has a circular shape, the wafer holding area α is usually formed to have circular shape in accordance with the shape of a wafer W. However, the shape of the wafer holding area α is not limited to circle. The wafer holding area α can be formed in ellipse, oval, or polygon as long as it can hold a wafer W.

In the inspection apparatus 1 of the present example, the chuck stage 2 is made of a conductive material, such as copper, received anti-rust plating treatment. As a part of the upper surface of the chuck stage 2 forms the wafer holding area α, the upper surface of the wafer holding area α is also conductive. When a wafer W is placed on the wafer holding area α, the conductive upper surface of the wafer holding area α is in contact with the back side of the wafer W. The part of the wafer holding area α which comes into contact with the back side of the wafer W is called as conductive contact parts.

On the other hand, the probe contact area β, which is an area where the probes for back side electrodes come into contact with, is formed on the upper surface of the chuck stage 2 next to the wafer holding area α. Accordingly, a part of the upper surface of the chuck stage 2 forms the probe contact area β. Since the chuck stage 2 in this example is made of a conductive material, such as copper, received anti-rust plating treatment as mentioned above, the probe contact area β is conductive and electrically continues to said conductive contact parts of the wafer holding area α through the wafer holding area α and the part of the chuck stage 2 other than the probe contact area β.

The size of the probe contact area β is set to cover the area having the same size and the same shape as the largest wafer W which is expected to be held on the wafer holding area α. In this example, it is supposed that a wafer W which is expected to be held on the wafer holding area α is in a circular shape having a diameter same as that of the wafer holding area α at largest. Therefore, the probe contact area β in this example is a circular area having the same radius as the wafer holding area α. However, the shape of the probe contact area β is not limited to circle. The probe contact area β can be formed in any shape, for example, in ellipse, oval, or polygon as long as it covers the area having the same size and the same shape as the largest wafer W to be inspected. While the probe contact area β may be same in size and shape as the largest wafer W which is expected to be held on the wafer holding area α, because it is sufficient that the probe contact area β covers the area having the same size and the same shape as the largest wafer W which is expected to be held on the wafer holding area α, it is preferable that the size and the shape of the probe contact area β are set to cover an area larger than the largest wafer W held on the wafer holding area α for the sake of prudence.

As explained above, the conductive upper surface of the chuck stage 2 itself composes both of the wafer holding area α and the probe contact area β in this example. However, a conductive sheet which covers the area having the same size and the same shape as the largest wafer W held on the wafer holding area α may be placed on the upper surface of the chuck stage 2 to utilize the upper surface of the conductive sheet as the probe contact area β. In the case that the conductive sheet is utilized as the probe contact area β, it is possible to exchange the conductive sheet only when the probe contact area β is damaged by repeated contacts with the probes for the back side electrodes, which reduces time and cost needed for maintenance.

As shown in FIG. 4, the chuck stage 2 exists on the XYZ-θ stage 5, and the wafer holding area α and the probe contact area β are formed on the chuck stage 2. Therefore, the wafer holding area α and the probe contact area β move together in the same direction when the XYZ-θ stage 5 is operated to move the chuck stage 2.

Figure 5:
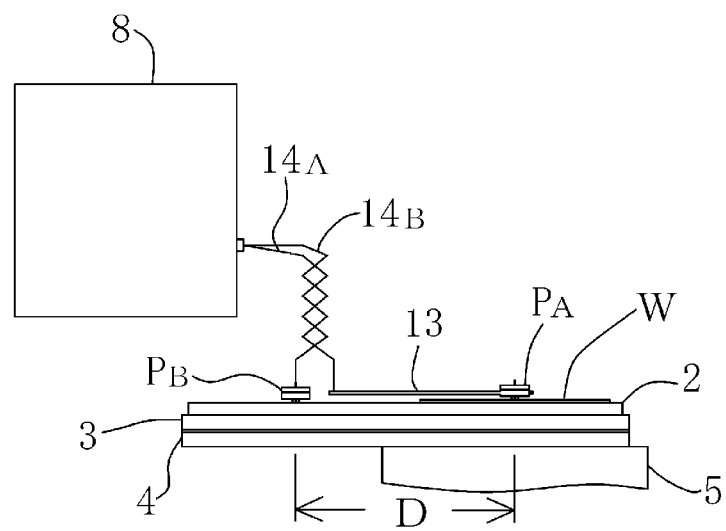
FIG. 5 is a front view showing the relationship between the chuck stage and the probes for front and back side electrodes.
Figure 6:
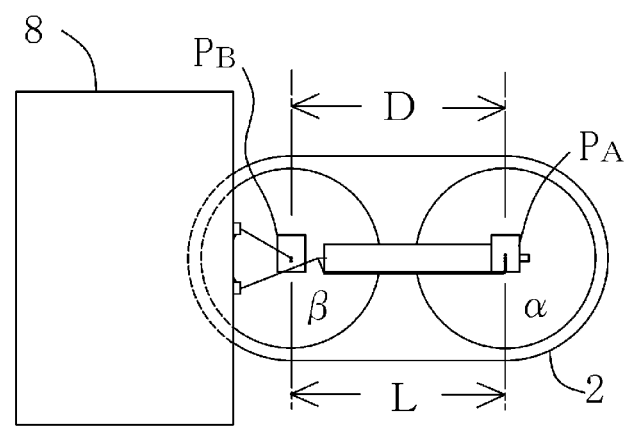
FIG. 6 is a plane view of FIG. 5.

FIG. 5 is a front view showing the relationship between the chuck stage 2 and the probes for front and back side electrodes. FIG. 6 is a plane view of FIG. 5. Only the components necessary to explain the relationship are shown in FIG. 5 and FIG. 6 for the sake of convenience. In FIG. 5 and FIG. 6, $P_A$ indicates the probes for front side electrodes and $P_B$ indicates the probes for back side electrodes. W is a wafer held on the wafer holding area α. The probes for front side electrodes $P_A$ and the probes for back side electrodes $P_B$ comprise more than one force probes and more than one sense probes, both not illustrated. Only one force probe is sufficient. However, it is preferable that there are more than one force probes, because it is necessary to apply large current when power semiconductor devices are inspected. Similarly, while only one sense probe is sufficient, it is preferable that there are more than one sense probes, because continuity check becomes possible when there are more than one sense probes. While depending on the types of the semiconductor devices to be inspected, the probes for front side electrodes $P_A$ usually has a gate probe or a base probe, not illustrated, in addition to the force probes and the sense probes.

The probes for front side electrodes $P_A$ and the probes for back side electrodes $P_B$ are located leaving a distance D in horizontal direction between them. The distance D is set so that the probes for front side electrodes $P_A$ come into contact with a wafer W held on the wafer holding area α and the probes for back side electrodes $P_B$ come into contact with the probe contact area β, when the chuck stage 2 is moved upward by the XYZ-θ stage 5. The conductive component for force line 13 is placed parallel to the upper surface of the chuck stage 2 and along the straight line connecting the probes for front side electrodes $P_A$ and the probes for back side electrodes $P_B$. In this example, the conductive component for force line 13 is a rigid and conductive component in a plate form. The one end of the conductive component for force line 13 nearer to the probes for front side electrodes $P_A$ is electrically connected to the more than one force probes comprised in the probes for front side electrodes $P_A$ and the other end of the conductive component for force line 13 is connected to the tester 8 via the conductive cable $14_A$. The probes for back side electrodes $P_B$ are connected to the tester 8 through the conductive cable $14_B$.

The symbol L in FIG. 6 represents the distance between the center of the wafer holding area α and the center of the probe contact area β. In this example, the distance D is set to be same or almost same as the distance L. Since the distance D is set to be same or almost same as the distance L and the probe contact area β covers the area having the same size and the same shape as the largest wafer W held on the wafer holding area α, the probes for back side electrodes $P_B$ relatively move within the probe contact area β when the probes for front side electrode $P_A$ relatively move within the wafer W to be inspected held on the wafer holding area α together with the movement of the chuck stage 2 by the XYZ-θ stage 5.

Figure 7:
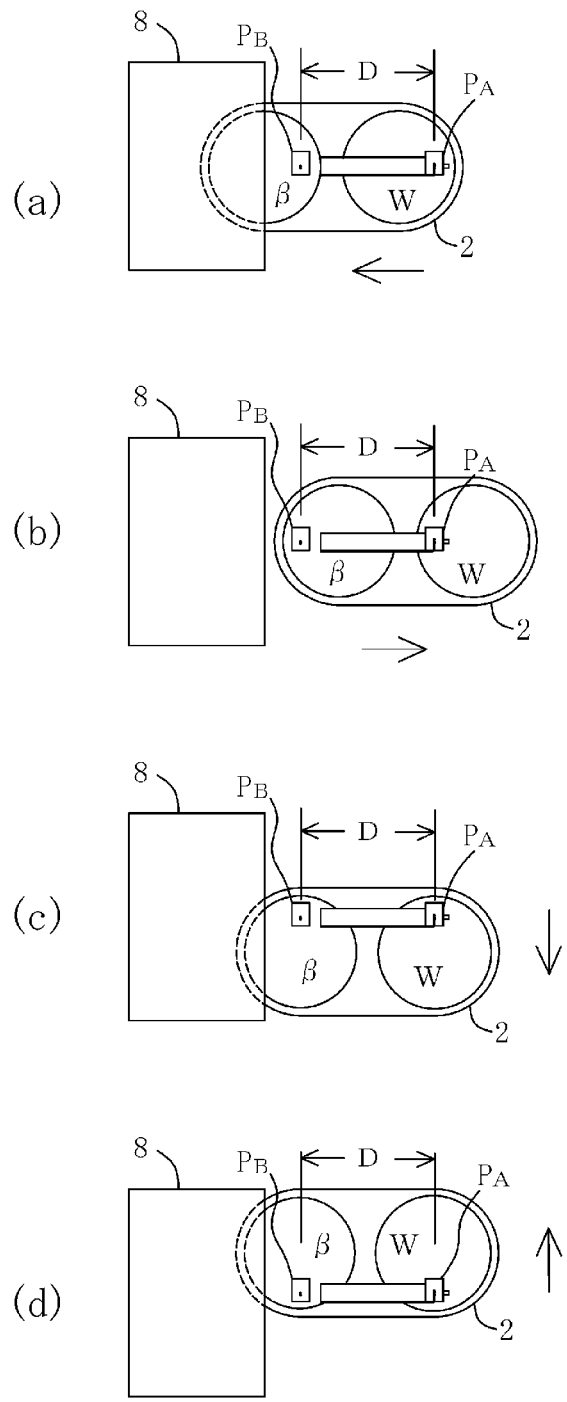
FIG. 7 is a plane view showing the movement of the probes for front side electrodes and the probes for back side electrodes.

FIG. 7 is a plane view showing the movement of the probes for front side electrodes $P_A$ and the probes for back side electrodes $P_B$. In FIG. 7, as the largest wafer held on the wafer holding area α, a circular wafer W having the same radius as the wafer holding area α is placed and held on the wafer holding area α. As shown in (a) to (d) of FIG. 7, when the chuck stage 2 moves right, left, up or down in the figures, the probes for front side electrodes $P_A$ relatively move within the wafer W held on the wafer holding area α. Corresponding to the movement of the probes for front side electrodes $P_A$, the probes for back side electrodes $P_B$ relatively move within the probe contact area β keeping the distance D from the probes for front side electrodes $P_A$.

As explained above, according to the inspection apparatus 1 of the present invention, even in the case that the chuck stage 2 is moved by the XYZ-θ stage 5 to inspect many semiconductor devices formed on a wafer W one by one, the probes for back side electrodes $P_B$ come into contact with the probe contact area β which electrically continues to the back side electrodes of a semiconductor device under inspection, whenever the probes for front side electrodes $P_A$ come into contact with the front side electrodes of the semiconductor device under inspection, thereby supplying necessary electric signals to the semiconductor device. Therefore, according to the inspection apparatus 1 of the present invention, it is possible to inspect electrical characteristics of semiconductor devices in wafer state. In addition, the positional relationships between the tester 8 and the probes for front side electrodes $P_A$ as well as the positional relationships between the tester 8 and the probes for back side electrodes $P_B$ are kept constant, because it is not necessary to move the probes for front side electrodes $P_A$ and the probes for back side electrode $P_B$ even in the case that many semiconductor devices on a wafer W are inspected one by one. Therefore, according to the inspection apparatus 1 of the present invention, the lengths of the electric connection lines which connect the tester 8 to the probes for front side electrodes $P_A$ and the probes for back side electrodes $P_B$ can be always kept shortest and constant, even in the case that many semiconductor devices on a wafer W are inspected one by one in wafer state. Accordingly, it is possible to obtain the transient characteristics necessary to conduct large current test close to the actual performance of the semiconductor device under test and dynamic characteristics test by minimizing parasitic inductance of measuring lines, which are advantageous effects.

Figure 8:
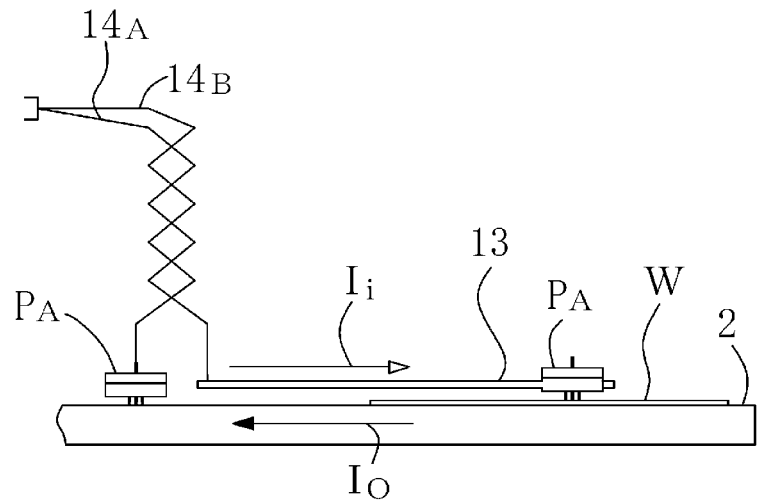
FIG. 8 is a schematic drawing showing electrical currents which flow in the conductive component for force line and the chuck stage.
Figure 9:
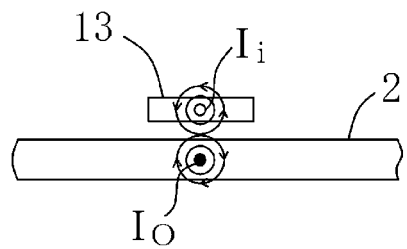
FIG. 9 is a schematic drawing showing the produced magnetic fields.

FIG. 8 is a schematic drawing showing electric currents which flow in the conductive component for force line 13 and the chuck stage 2. FIG. 9 is a schematic drawing showing the magnetic fields produced by the electric currents. On inspection, an electric circuit is formed, which starts the tester 8 and goes back to the tester 8 through the conductive cable $14_A$, the conductive component for force line 13, force probes in the probes for front side electrodes $P_A$, a semiconductor device on a wafer W, the conductive contact parts of the wafer holding area α, the chuck stage 2, the probe contact area β, the probes for back side electrodes $P_B$ and the conductive cable $14_B$ in this order. The electric current Ii shown in the figure flows in the conductive component for force line 13, and the electric current Io shown in the figure flows in the chuck stage 2. Since the conductive component for force line 13 is placed parallel to the upper surface of the chuck stage 2 along the straight line connecting the probes for front side electrodes $P_A$ and the probes for back side electrodes $P_B$, the direction of the magnetic field produced by the electric current Ii is opposite to the direction of the magnetic field produced by the electric current Io as shown in FIG. 9, and the two magnetic fields are cancelled each other. Due to this, the effective inductance of the electric current path between the probes for front side electrodes $P_A$ and the probes for back side electrodes $P_B$ can be reduced, and measurements with high accuracy and better transient characteristics are realized.

The conductive component for force line 13 is not limited to a rigid and conductive component in plate form as long as it can be placed parallel to the upper surface of the chuck stage 2 along the straight line connecting the probes for front side electrodes $P_A$ and the probes for back side electrodes $P_B$. The conductive component for force line 13 may be a liner component with circular cross section. However, as the chuck stage 2 in which electric current Ii flows is in plate form, the conductive component for force line 13 is preferably in plate form having the width larger than the gap between the conductive component for force line 13 and the chuck stage 2 in order to form parallel coupling structure with the chuck stage 2 holding air as dielectric material between them.

Figure 10:
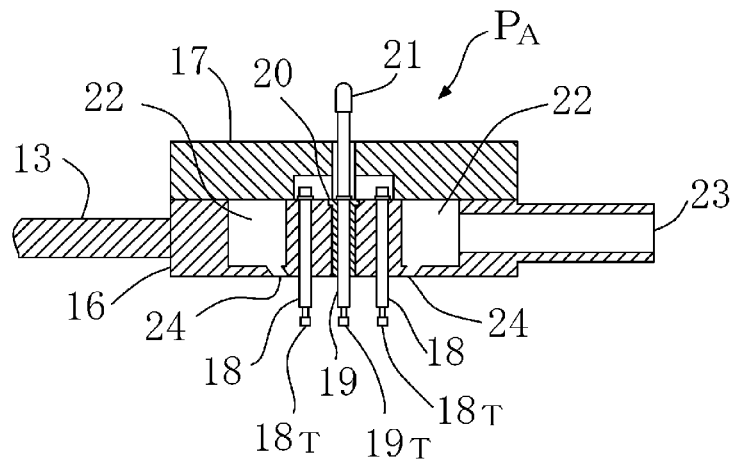
FIG. 10 is an enlarged partial cross section showing the probes for front side electrodes.

FIG. 10 is an enlarged partial cross section showing the probes for front side electrodes $P_A$. In FIG. 10, the reference numeral 16 indicates a probe block and the reference numeral 17 indicates a block cover. The probe block 16 is made of a conductive material and is electrically connected to the conductive component for force line 13 by being joined to the conductive component for force line 13. The reference numeral 18 indicates a force probe. The force probes 18 are attached to the probe block 16 by being inserted and fixed in a hole for fixing formed in the probe block 16. The force probes 18 are in contact with the inner surface of the fixing hole and thereby electrically continues to the probe block 16 and the conductive component for force line 13. The reference numeral 19 indicates a sense probe. The sense probe 19 is attached to the probe block 16 by being inserted and fixed in a hole for fixing formed in the probe block 16. The sense probe 19, however, is electrically insulated from the probe block 16 and the conductive component for force line 13, because an electrical insulating material 20 exists between the sense probe 19 and the inner surface of the hole for fixing.

The end part $18_T$ of the force probe 18 and the end part $19_T$ of the sense probe 19 are pressed downward by an elastic means, not illustrated, which contained in the force probe 18 and the sense probe 19, respectively. When any external force is applied upward, the end part $18_T$ and the end part $19_T$ are able to move upward according to the strength of the external force. The reference numeral 21 indicates a conductive cable which connects the sense probe 19 and the tester 8.

The reference numeral 22 indicates a cooling chamber formed in the probe block 16, the reference numeral 23 indicates a cooling air entrance and the reference numeral 24 indicates a cooling air nozzle. The cooling air entrance 23 is connected to an appropriate cooling air source, not illustrated. Cooling air flows into the cooling chamber 22 from the cooling air source through the cooing air entrance 23 and cools the force probes 18 and the sense probe 19 and further the gate probe, which mentioned below, as well as the probe block 16. The cooling air goes out from the cooling air nozzle 24 and further cools a semiconductor device under test which is located below the probes for front side electrodes $P_A$. As explained above, the probes for front side electrodes $P_A$ in this example has a cooling means for the probes and the semiconductor device under test. Therefore, according to the probes for front side electrodes $P_A$ in this example, excessive rise in temperature of the probes and a semiconductor device under test is well prevented even when large electric current is supplied to the semiconductor device for inspection. Due to this, more stable and more accurate inspection is realized. Cooling medium is not limited to air. Appropriate gases other than air, such as nitrogen gas, can be of course used as cooling medium.

Figure 11:
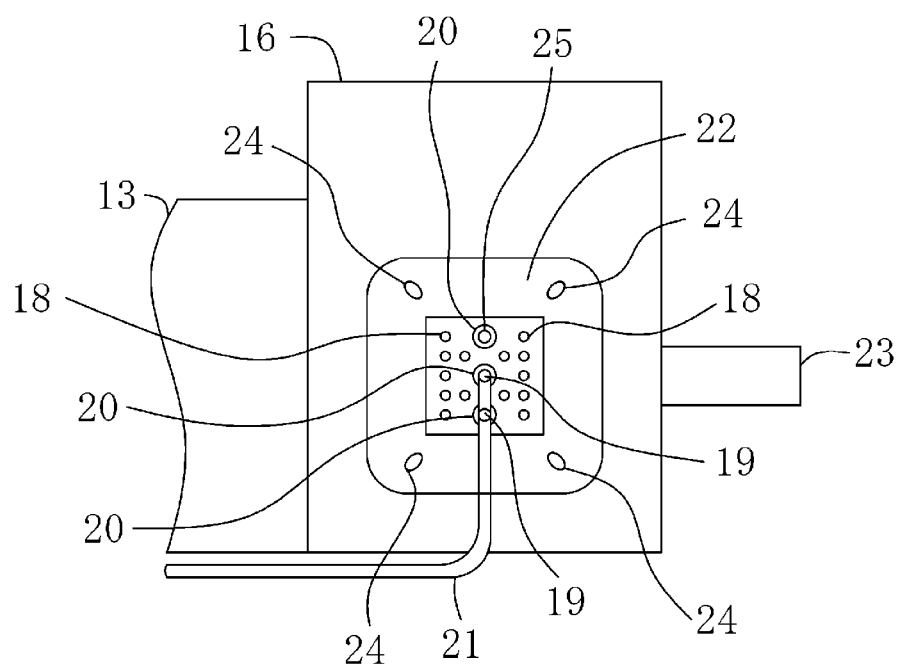
FIG. 11 is an enlarged plane view showing the probes for front side electrodes.
Figure 12:
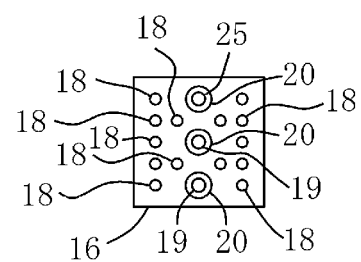
FIG. 12 is a plane view showing only a part of FIG. 11.

FIG. 11 is an enlarged plane view showing the probes for front side electrodes $P_A$ without the block cover 17. FIG. 12 is a plane view showing only the probes in FIG. 11. The reference numeral 25 indicates the gate probe, and an electrically insulating material 20 is inserted between the gate probe 25 and the probe block 16. The gate probe 25 is therefore electrically insulated from the conductive component for force line 13 as well as the probe block 16. The gate probe 25 is connected to the tester 8 with a connecting cable, not illustrated.

As shown in FIG. 11 and FIG. 12, each of the probes is located at a lattice point of a lattice pattern. Fourteen (14) force probes 18 in total are located at the lattice points of the lattice pattern respectively except the lattice points neighboring two sense probes 19 and one gate probe 25. The arrangement and the number of the various probes as shown in FIG. 11 and FIG. 12 are just one example. It is a matter of course that the arrangement and the number of the force probes 18, sense probes 19, and gate probe 25 are not limited to those as shown in FIG. 11 and FIG. 12.

While the probes for front side electrodes $P_A$ are explained above, the probes for back side electrodes $P_B$ are basically same as the probes for front side electrodes $P_A$ except that they do not equip the gate probe 25 and slightly different from probes for front side electrodes $P_A$ in the sizes and the arrangements of the force probes 18 and sense probes 19.

Figure 13:
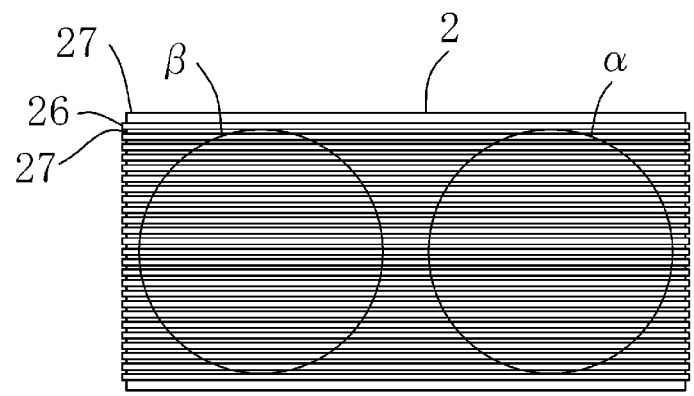
FIG. 13 is a plane view showing another example of the chuck stage.
Figure 14:
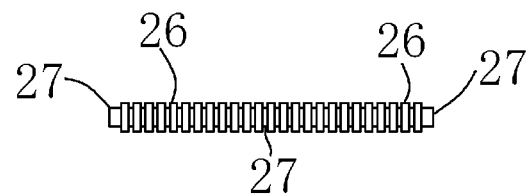
FIG. 14 is a side view showing another example of the chuck stage.
Figure 15:
FIG. 15 is a front view showing another example of the chuck stage.
Figure 16:
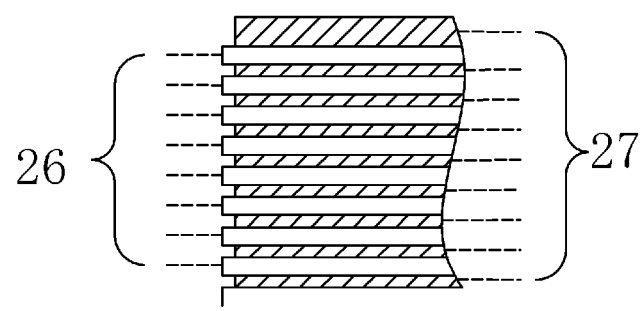
FIG. 16 is a partially enlarged view of FIG. 13.

FIG. 13 is a plane view showing another example of the chuck stage 2. FIG. 14 is a side view thereof, FIG. 15 is a front view thereof, and FIG. 16 is a partially enlarged view of FIG. 13. As shown in the figures, the chuck stage 2 of this example is divided into a number of long rectangular parts which are parallel to each other and lie along the line connecting the wafer holding area α and the probe contact area β. The long rectangular parts consist of conductive components 26 and electrically insulating components 27 which are located one after the other (In FIG. 16, the electrically insulating components 27 are shown with hatching for the sake of easy understanding). The height of the conductive components 26 is larger than that of the electrically insulating components 27 and the upper surface of the chuck stage 2 is formed by the upper surfaces of the conductive components 27. A part of the upper surface of the chuck stage 2 formed by the upper surfaces of a number of the conductive components 27 functions as conductive contact parts of a wafer holding area α which are in contact with the back side of a wafer W, and another part of the upper surface of the chuck stage 2 functions as a probe contact area β. As an electrically insulating component 27 is inserted between every two neighboring conductive components 26, every two neighboring conductive components 26 are electrically insulated from each other. Therefore the conductive contact parts of the wafer holding area α which are in contact with the back side of a wafer W electrically continues to the probe contact area β through a number of conductive components 26 which are in straight line form and electrically insulated from each other.

As shown in FIG. 14 and FIG. 15, the thin plate like conductive components 26 and the similarly thin plate like electrically insulating components 27, which are smaller than the conductive components 26 in size, are piled up one after the other to form the chuck stage 2 in this example. Such the chuck stage 2 can be produced by positioning and piling up the conductive components 26 and the electrically insulating components 27 one after the other and adhering or fusing them together. However, the structure of the chuck stage 2 which is composed of the conductive components 26 and the electrically insulating components 27 located one after the other and parallel to each other is not limited to that as shown in the figures. For example, a number of the long rectangular conductive components 26 can be attached on an electrically insulating plate parallel to each other and leaving a space between every neighboring two conductive components 26 by appropriate means such as adhesion, fusion, evaporation, or plating to form a chuck stage 2 in which the conductive components 26 and the electrically insulating components 27 are located one after the other. A chuck stage 2 in which the conductive components 26 and the electrically insulating components 27 are located one after the other can be also produced by preparing an electrically insulating plate having a number of straight grooves on its surface and fitting into each of the grooves the conductive component 26.

Figure 17:
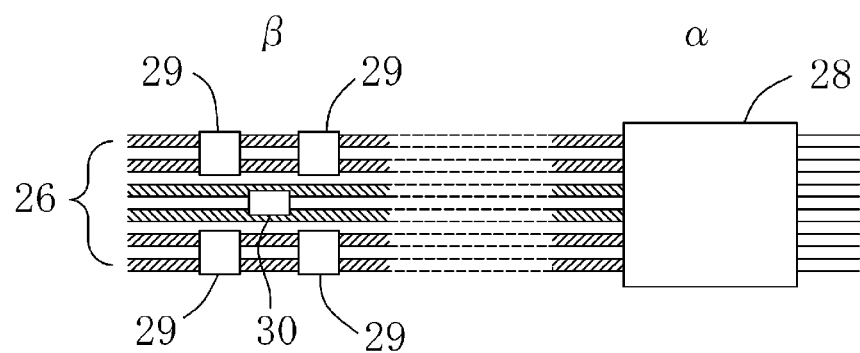
FIG. 17 is a plane view showing electrically continuing paths formed between the back side electrodes of a wafer and the probes for back side electrodes.

FIG. 17 is a plane view showing electrically continuing paths which are formed between the backside electrodes of a wafer W and the probes for back side electrodes $P_B$ when the chuck stage 2 as shown in FIG. 13 is used. In FIG. 17, the reference numeral 28 indicates a semiconductor device under test, the reference numeral 29 indicates a force probe in the probes for back side electrodes $P_B$, and the reference numeral 30 indicates a sense probe in the probes for back side electrodes $P_B$.

A number of the conductive components 26 in the chuck stage 2 lie along the line which goes from the wafer holding area α to the probe contact area β. The direction of the line is same or almost same as that of the straight line connecting the probes for front side electrodes $P_A$ and the probes for back side electrodes $P_B$. Therefore, when the probes for front side electrodes $P_A$ come into contact with the electrodes formed on the front side of the semiconductor device 28 under test, the back side electrodes of the wafer W just under the semiconductor device 28 and the force probes 29 as well as the sense probe 30 in the probes for back side electrodes $P_B$ come into contact with the same conductive components 26. In other words, the back side electrodes of the wafer W just under the semiconductor device 28 are electrically connected to the force probes 29 and the sense probe 30 in the probes for back side electrodes $P_B$ straightly with electrically continuing paths composed by the long rectangular conductive components 26 which lie along the line going from the wafer holding area α to the probe contact area β. As explained above, the electrical continuing paths which go from the back side of the wafer W to the probes for back side electrodes $P_B$ are restricted to the long rectangular conductive components 26 when the chuck stage 2 as shown in FIG. 13 is used. Accordingly, the parasitic inductances and the parasitic capacitances, which may be produced, are well reduced, which brings the advantageous effects that the transient characteristics are improved and high speed and more accurate inspection is realized.

Since a number of the conductive components 26 are electrically insulated from each other, the electrically continuing paths connecting the back side electrodes of the wafer W and the force probes 29 in the probes for back side electrodes $P_B$ are electrically insulated from the electrically continuing paths connecting the back side electrodes of the wafer W and the sense probe 30 in the probes for back side electrodes $P_B$, unless one of the force probes 29 and the sense probe 30 are in contact with the same conductive component 26. Therefore, it is possible to transfer the electric signals for force use from the back side electrodes of the wafer W to the tester 8 via electrically continuing paths different from those used to transfer the electric signals for sense use from the back side electrodes of the wafer W to the tester 8, even though the probe contact area β is used in common. This is an advantageous effect of this example. In order that the force probes 29 and the sense probe 30 may not come into contact with the same conductive component 26, the force probes 29 and the sense probe 30 should be located, for example, to leave between them a space in a direction perpendicular to the conductive components 26 larger than both of the widths of one conductive component 26 and one electrically insulating component 27.

INDUSTRIAL APPLICABILITY

As explained above, according to the inspection apparatus for semiconductor devices and the chuck stage used for the same of the present invention, the transient characteristics which are necessary to conduct large current test close to the actual performance of the semiconductor device under test and dynamic characteristics test are obtained even when semiconductor devices having the electrodes on both sides of the wafer, such as power semiconductor devices, are inspected in wafer state. Therefore, more accurate inspections of the semiconductor devices in wafer state are possible. According to the present invention, it is possible to avoid inconvenience that characteristics failure of semiconductor devices are found in a final full-spec inspection for the first time, and thereby effectively prevent increase of the volume of waste and rise of the product cost which are cause by useless processes. The present invention possesses great industrial applicability.

What is claimed is:

1. An inspection apparatus for semiconductor devices, which comprises;
    probes for front side electrodes, probes for back side electrodes, a chuck stage which relatively moves with respect to the probes for front side electrodes and the probes for back side electrodes, a wafer holding area which holds a wafer to be inspected, and a probe contact area which is conductive and covers an area having the same size and the same shape as the largest wafer to be held on the wafer holding area,
    wherein, the wafer holding area and the probe contact area are formed on the upper surface of the chuck stage close to each other but without overlapping of the areas, the wafer holding area has conductive contact parts which are to be in contact with the back side of the wafer, and the probe contact area electrically continues to the conductive contact parts of the wafer holding area through conductive parts of the wafer holding area and the upper surface of the chuck stage other than the probe contact area, and,
    wherein the probes for front side electrodes and the probes for back side electrodes are placed leaving a distance in horizontal direction between them so that the probes for back side electrodes relatively move within the probe contact area when the probes for front side electrodes are relatively moved within the wafer under test by the movement of the chuck stage.

2. The inspection apparatus for semiconductor devices according to claim 1, wherein the probes for front side electrodes and the probes for back side electrodes have one or more force probes and one or more sense probes.

3. The inspection apparatus for semiconductor devices according to claim 2, which comprises a conductive component for force line, which is placed parallel to the upper surface of the chuck stage and along a straight line connecting the probes for front side electrodes and the probes for back side electrodes, wherein one end of the conductive component for force line nearer to the probes for front side electrodes is electrically connected to the one or more force probes comprised in the probes for front side electrodes, and the other end of the conductive component for force line is connected to a tester.

4. The inspection apparatus for semiconductor devices according to claim 3, wherein the conductive component for force line is in plate form.

5. The inspection apparatus for semiconductor devices according to claim 1, wherein the upper surface of the chuck stage is made of a conductive material, and a part of the upper surface made of a conductive material forms the conductive contact parts of the wafer holding area, and another part of the upper surface made of a conductive material forms the probe contact area.

6. The inspection apparatus for semiconductor devices according to claim 1, wherein the upper surface of the chuck stage is made of a conductive material, and a part of the upper surface made of a conductive material forms the conductive contact parts of the wafer holding area, and a conductive sheet placed on another part of the upper surface made of a conductive material forms the probe contact area.

7. The inspection apparatus for semiconductor devices according to claim 1, wherein the upper surface of the chuck stage is divided into a number of long rectangular parts which are parallel to each other and lie along a line connecting the wafer holding area and the probe contact area, and the long rectangular parts consist of conductive components and electrically insulating components which are located one after the other, and a part of the upper surface of the conductive components forms the conductive contact parts of the wafer holding area and another part of the upper surface of the conductive components forms the probe contact area.

8. A chuck stage, comprising:
a wafer holding area which holds a wafer to be inspected, and a probe contact area which is conductive and covers an area having the same size and the same shape as the largest wafer to be held on the wafer holding area, wherein, the wafer holding area and probe contact area are formed on the upper surface of the chuck stage close to each other but without overlapping of the areas, the wafer holding area has conductive contact parts which are to be in contact with the back side of the wafer, and the probe contact area electrically continues to the conductive contact parts of the wafer holding area through conductive parts of the wafer holding area and the upper surface of the chuck stage other than the probe contact area.

9. The chuck stage according to claim 8, wherein the upper surface of the chuck stage is divided into a number of long rectangular parts which are parallel to each other and lie along a line connecting the wafer holding area and the probe contact area, and the long rectangular parts consist of conductive components and electrically insulating components which are located one after the other, and a part of the upper surface of the conductive components forms the conductive contact parts of the wafer holding area and another part of the upper surface of the conductive components forms the probe contact area.

* * * * *